United States Patent [19]

Donahue

[11] Patent Number: 4,837,488
[45] Date of Patent: Jun. 6, 1989

[54] PORTABLE IDENTIFIER AND TESTER UNITS FOR COMPUTER COMMUNICATION CABLES

[75] Inventor: Keith C. Donahue, Centerville, Ohio
[73] Assignee: NCR Corporation, Dayton, Ohio
[21] Appl. No.: 190,906
[22] Filed: May 6, 1988
[51] Int. Cl.$^4$ ............................................. G01R 31/02
[52] U.S. Cl. ...................................... 324/66; 379/21; 324/539
[58] Field of Search ................. 324/539, 540, 542, 66; 379/21, 25, 26; 340/650, 651

[56] References Cited

U.S. PATENT DOCUMENTS

| | | | |
|---|---|---|---|
| 3,369,177 | 2/1968 | Graham et al. | 379/25 |
| 3,378,764 | 4/1968 | Peltz et al. | 324/542 |
| 3,778,801 | 12/1973 | Nudelmont | 340/651 |
| 4,326,162 | 4/1982 | Hankey | 324/542 |
| 4,536,703 | 8/1985 | Jablway et al. | 379/21 |
| 4,551,671 | 11/1985 | Annunziata et al. | 324/539 |
| 4,581,577 | 4/1986 | Nowosad et al. | 324/539 |
| 4,701,699 | 10/1987 | Hoff | 379/21 |
| 4,703,497 | 10/1987 | Ingalsbe | 324/66 |
| 4,736,158 | 4/1988 | McCartney | 324/539 |

Primary Examiner—Reinhard J. Eisenzopf
Assistant Examiner—Maura K. Regan
Attorney, Agent, or Firm—Wilbert Hawk, Jr.; Casimer K. Salys

[57] ABSTRACT

A portable cable identifier and tester assembly for a four line token ring network type cable, including a first unit having a power supply and connector mateable to one end of the cable and a second unit mateable to ends of potentially matching cables to provide a signal indicating cable identification. Jumpers are provided in each of the units to ensure that the test signal current is routed through all four wires and connectors. Shorting bars between cable lines in unmated connectors, and spurious personal computer supply voltages, do not inhibit cable identification. User ease and self-test are inherent features.

10 Claims, 5 Drawing Sheets

PORTABLE IDENTIFIER AND TESTER UNITS FOR COMPUTER COMMUNICATION CABLES

BACKGROUND OF THE INVENTION

The advent of local area networks suitable to interconnect multiple work stations or personal computers for communication or resource sharing purposes has proliferated the installation of computer electrical cabling systems. A communication network or system of particular interest and expanding popularity is known as the token ring architecture. The network is characterized by a closed loop information transmission path.

The electrical cables used within a token ring type local area network utilize end connectors with normally closed shorting bars. The shorting bars disconnect upon mating of the cable connector. Once mated into a token ring network the whole of the cable becomes an element in the transmission path of the token ring network, the shorting bars providing the return path from unmated cable ends. In this preferred and presently commonly utilized token ring network the cable is comprised of four electrically distinct wires which under the influence of the shorting bars loop in pairs.

The token ring cables are used in local area networks which extend not only within defined office areas or floors of buildings, but are fully capable of being routed throughout an extended structural complex. Experience with such cables has shown that the tags routinely used to identify the corresponding ends of cables are often missing, damaged or incorrectly marked. Also, multiple cables are frequently installed during the same time and without end connectors. Consequently, the identification of matching cable ends has become a reoccurring problem for the electricians or technicians connecting the local area networks. The presence of shorting bars in unmated cable connectors, and the impedances or voltages generated by the computers connected into token ring networks, further complicate the identification of cables added into existing networks.

U.S. Pat. No. 4,471,293 describes a cable tester for evaluating continuity and shorting. Both ends of the cable under test must be connected to the workbench style test unit. U.S. Pat. No. 4,556,839 relates to a power line identifier in an AC wiring system. Line identification is accomplished by creating pulsating loads at one end of the line and detecting current surges at intermediate line locations. Another potentially related U.S. patent is U.S. Pat. No. 4,703,497, directed to a telephone cable tester. However, the tester is not configurated to identify cables nor is the tester operable in the context of a cable which has selectively shorted connector ends. International Business Machines (IBM) Corporation manufactures and sells a cabling system tester identified as Part No. 4760501, or in a kit as Part No. 4760500. The IBM unit is designed to test the token ring multistation access unit (MAU) operation or, in the case of a token ring cable connected to the MAU, the combination of the MAU and cable continuity. A portable MAU tester and initializer unit is also available from NCR Corporation, under the identification S/N 902-0010108. The NCR unit incorporates a token ring cable connector which when mated to the MAU will initialize the coil latching relay in the MAU. MAU relay operation is confirmed by the relay noise associated with switching. In contrast to its combined use in the present invention, the standard NCR MAU tester and initializer unit does not include internal shunting by jumper wire across selected connector pins.

Consequently, there exists a need for a portable device which identifies corresponding cable ends, is not misled by cable connectors having shorting bars, includes a capability to concurrently evaluate the continuity of the cable lines, does not erroneously respond to low level voltages inadvertently present on cables, and includes a selftest capability. Moreover, in contrast to the relatively complex apparatus in the prior art, the portable cable identifier and tester assembly should be operable by a single individual with minimum understanding of the cable characteristics, of the work station or personal computer signal characteristics, or of the local area network configuration.

SUMMARY OF THE INVENTION

The present invention is directed to a portable identifier and tester assembly for multiple wire computer communication cables or the like. The identifier and tester assembly is comprised of two parts. The first part is in some respects similar to the formerly noted NCR MAU tester and initializer unit, but now including a jumper wire within the connector to allow a looped testing of the cable lines. The second part of the present identifier and tester assembly is structurally similar in its portability, but includes a voltage sensitive oscillator, a cable match signal generator, and a shunting jumper wire differently configured than that in the first unit. The two units are mateable for self-test and mateable individually to the ends of the cable subject to identification and testing. The first unit power supply is not shorted out upon being connected to a token ring cable having an unmated, and therefore selectively shorted, opposite end. Correspondingly, the second unit, when mated to the end of an unknown cable, does not respond to any cable lacking the counter part first unit at its opposite end. The second unit is expressly designed to ignore the nominally five volt levels generated by the computer apparatus connected into a token ring system, while being fully responsive to the higher voltage provided by the complementary first unit.

The presence of a signal in the second unit to identify a match of the token ring cable ends also confirms that all four cable lines at both cable connector ends are electrically connected through the four contacts of each portable identifier and tester unit. The jumper wires loop the cable match detection signal current through all four contacts in each connector.

The signal which designates a cable match is unambiguous in its utilization of a visually perceived LED flashing at a frequency of approximately one hertz. For example, continuous illumination of the LED or flashing rates materially different than the acceptable nominal rate indicate a mismatch of the cable ends or the presence of a defect in the identifier and tester units.

The matching of the cable ends is uniquely complicated by the fact token ring network cables have connectors with shorting bars operable when unmated. Furthermore, the closed loop created by mated token ring cables, is particularly vulnerable to low voltage signals inadvertently placed onto the loop path. Consequently, identification of matching cable connectors in the context of a building can become a major undertaking for even a skilled technician.

The present invention is used by first connecting one unit of the portable identifier and tester assembly into the first end of the cable to be identified. The corresponding opposite end of the desired cable is identified by inserting of the second unit of the pair into the distantly located cable connectors while viewing the response of the LED detection circuit to detect a match by the presence of the nominally defined flashing rate.

The portable identifier and tester units are a complementary pair. The first unit includes a power supply and voltage divider, and is suitable to perform the former function of MAU tester and initializer unit while including a jumper wire to allow looping of signals through the cable lines. The second unit of the pair has no internal power source but incorporates a threshold responsive astable multivibrator which drives a LED at a defined low frequency rate of flashing using power derived from the first unit. The connector of the second unit also includes a jumper wire to complete the looping of the electrical path through all four lines of the cable.

These and other features of the invention will be more clearly understood and more fully appreciated upon considering the detailed description which follows.

DESCRIPTION OF THE PREFERRED EMBODIMENT

Figure 1:
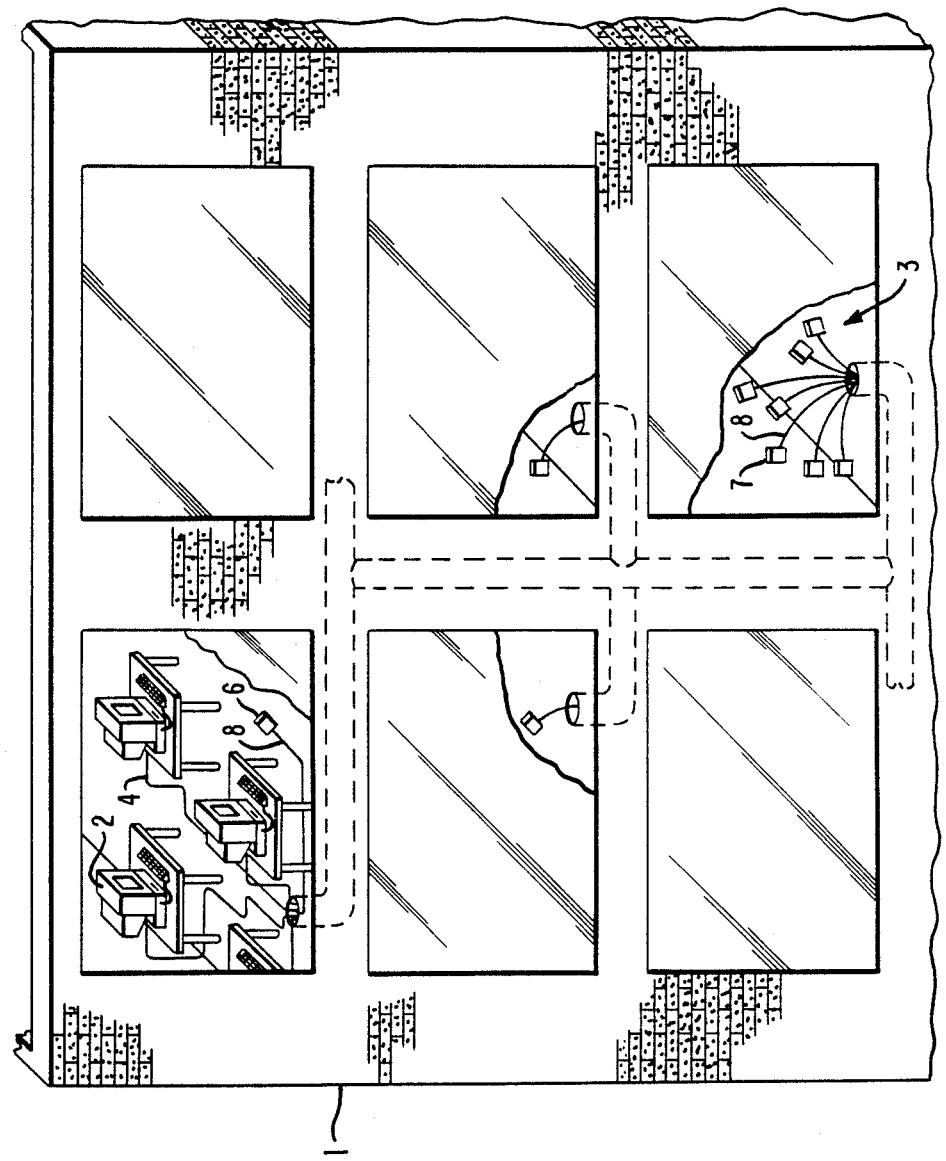
FIG. 1 is a schematic representation of a local area network cabling system within a building.

FIG. 1 schematically illustrates the context within which the invention is preferably used and is likely to require the benefits of the various incorporated features. The illustration depicts a local area network situated within a building 1 whereby various personal computers or work stations 2 are configured to be connected to a multistation access unit (MAU) or controller situated in a single location, generally 3, so as to receive the cables from each of the individual work stations or personal computers and interconnect such systems into a token ring network. In the context of the preferred token ring embodiment, each personal computer or work station is connected through a four ire cable 4 to the central communication location 3, generally the position of the MAU box. The cables 4 may be placed so that each is readily identifiable, but more likely as illustrated in FIG. 1, the cables will be routed through conduits so that the correspondence of the cable connectors 6 and 7 for the ends of single cable 8 are not readily discernable. Furthermore, as is illustrated the cables are likely to be broadly disbursed within the building with some being mated to operable systems and others completely disconnected.

The present invention is designed so that a technician having no greater than moderate skill or training can identify in the context of FIG. 1 the corresponding connectors 6 and 7 of specific cable 8 in a token ring network where unmated connectors have selective shorting bars, where some cables are connected to personal computers or workstations, and where cable end identification is either missing or otherwise incorrect. Matching of the cable connectors by continuity testing is obviously not feasible. The alternatives are not readily apparent in that tests conducted from central location 3 may result in a confusion of the shorting bars in connector 6 with the impendence effects on cable 4 connected into a personal computer or work station, which is subject to even further confusion if during such measurements from location 3 are conducted while any one of the personal computer or work station systems is inadvertently energized to place upon the token ring network a nominal voltage of approximately five volts.

The dilemma may be solved as now disclosed by using the portable identifier and tester assembly to identify the corresponding ends of cable 8. The first unit is mated by the technician to token ring cable connector 6. The technician then takes the second unit to the distant location 3 and there proceeds to mate the second unit into the cable connectors potentially corresponding to cable 8. In the context of the preferred embodiment, the corresponding connector 7 of cable 8 is identified by the presence of a low frequency repetitive flash of the light emitting diode (LED) in the second unit upon mating with the correct connector 7. In contrast, the absence of any flashing, or the presence of a high frequency flash, would indicate that the second unit is not connected to cable 8.

The inclusion of selective short circuit connections by jumper within the pair of identifier and tester units ensures that the flashing at appropriate frequency also confirms a continuity of the four cable lines between opposite end connectors 6 and 7. A single open line, namely a defective cable or connector, would inhibit flashing of the signal LED. Thereby, cable 8 is not only identified but continuity tested during a simultaneous use of the portable identifier and tester unit assembly.

Figure 2:
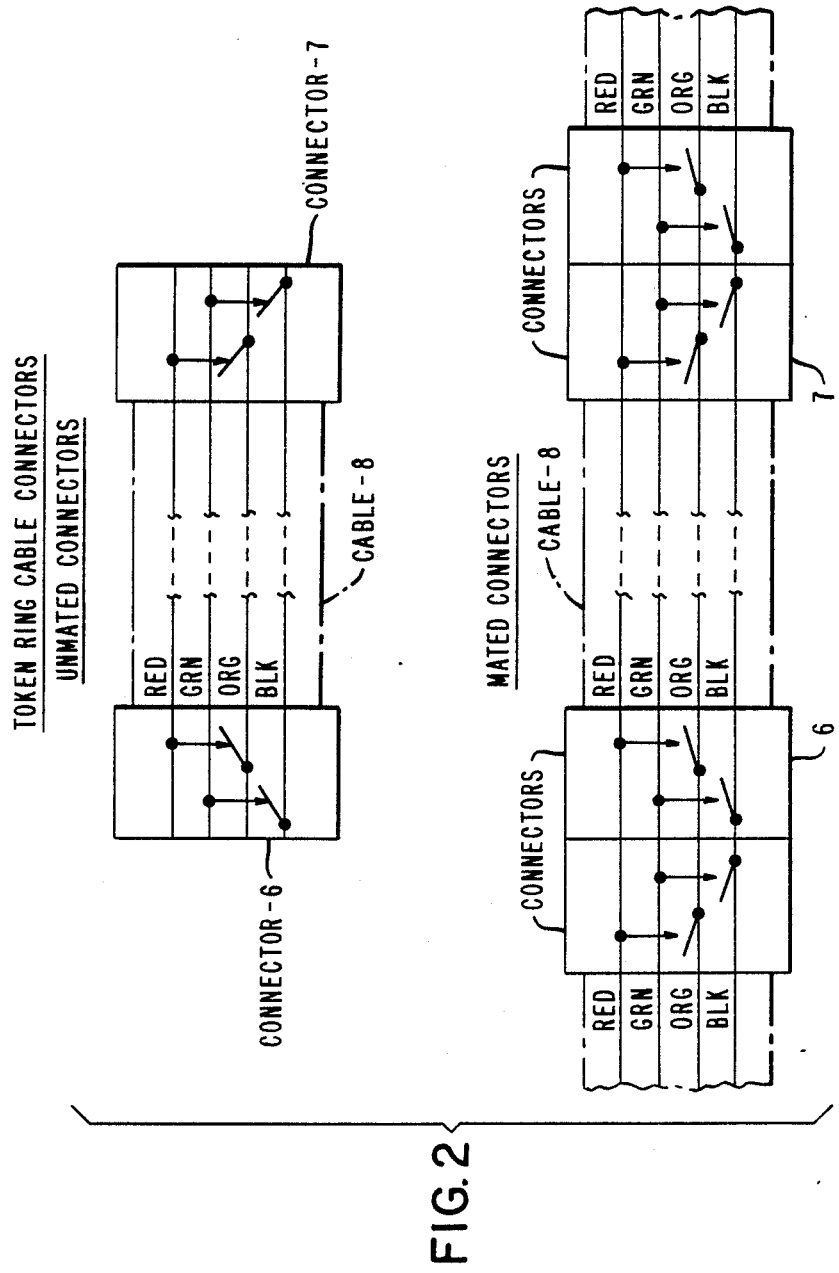
FIG. 2 illustrates the electrical states of the shorting bars of a token ring cable connector for both the mated and unmated states.

A greater appreciation for the complexity of the token ring cable environment may be gained by considering, as shown in FIG. 2, the various states of the connectors used within a four wire token ring cable. In an unmated state connectors 6 and 7 of token ring cable 8 have shorting bars which are arranged to electrically connect the black wire to the green wire, and the orange wire to the red wire. Those having experience with token ring networks will recognize that this arrangement of shorting bars in the connectors ensures that the communication loop remains intact even if a personal computer or work station is disconnected from the network.

Mating of the connectors 6 or 7 causes disengagement of the shorting bars, and as would be expected, a direct connection of lines between connected cables, as illustrated in FIG. 2. It should be appreciated that the mating may be to another cable or directly into a personal computer, work station, or network interface box. What should be noted is that cable continuity varies depending on the connective state of the cable. Therefore, in the context of Fig. 1, identification of cable 8 in the context of the network depicted in FIG. 1 involves significantly more than continuity testing.

Figure 3:
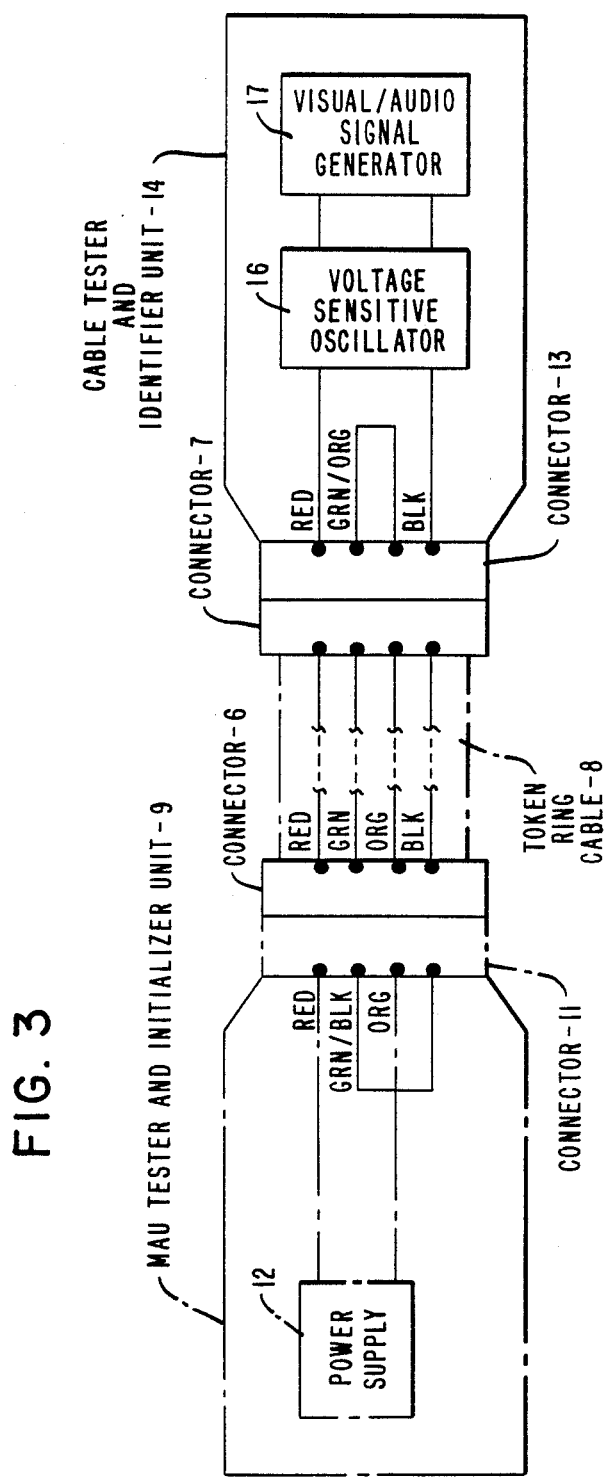
FIG. 3 schematically illustrates the functional elements of the present portable identifier and tester units when connected to a token ring cable, and further identifies the elements of the prior art MAU initializer and tester unit.

FIG. 3 illustrates by a block diagram the functional electronic elements within the two units which form the embodying portable identifier and tester assembly, again in the context of a token ring cable network characterized by connectors incorporating selective shorting bars. Connector 6 of cable 8 is mated to the earlier described MAU tester and initializer unit 9 through connector 11, a structurally integrated part of unit 9. The elements in MAU tester and initializer unit 9 which are in the prior art are shown by a dashed line, including the connector assembly and housing 11 and power supply 12. The power supply provides a voltage nominally greater than that generated within any personal computer or work station potentially attached to the token ring cable network on the red and orange lines of unit 9. To provide the benefits of the present invention, the unit 9 is modified to incorporate a jumperwire to short circuit the green and black lines of connector 11. The jumper serves to loop the electrical current through an additional pair of cable lines in the course of insuring continuity through all the connectors and lines of the cable.

The second unit of the identifier and tester assembly is structurally similar to the extent that it possesses a connector 13 mateable in standard fashion to connector 7 of token ring cable 8. The cable tester and identifier unit 14 is unique in its embodiment of a voltage sensitive oscillator 16 and a visual, or in the alternative an audio, responsive signal generator 17 between the red and black lines of the connector 13. The green and orange lines of the connector 13 are short circuited by a jumper wire to facilitate the previously noted continuity check of the cable lines and connectors.

Voltage sensitive oscillator 16 is designed to ignore low voltages of the level nominally generated by personal computer or work station systems on a token ring cable, to be responsive to the voltage generated by power supply 12 in the provision of a signal to the visual/audio generator 17 of defined character, and, lastly, to provide a signal of abnormal character to the visual/audio signal generator 17 when a higher than prescribed voltage is detected between the red and black lines.

The continuity testing implemented by the jumper wires within the respective test units can be understood by tracing the looping path through the cable and connectors, e.g. beginning on the orange line from power supply 12 in unit 9, which is looped to the green line in unit 14, and thereafter looped to the black line in unit 9, and eventually returns on the black line into unit 14. The red line from power supply 12 in unit 9 passes directly to the red line in unit 14. Consequently a break in any line or connector would result in break of the current path and therefore a failure to satisfy the cable identification and test sequence.

As another consideration of the combined arrangement of the present identifier and tester assembly note that the placement of the power supply 12 in unit 9, in contrast to locating it in unit 14, ensures that the shorting bars in unmated cable ends do not inadvertently trigger the cable tester and identified unit 14. Note in FIG. 2 that the shorting bars connect the black line to the green line and the orange line to the red line.

A further feature of the invention may also be understood from the schematic diagram in FIG. 3. This feature is the self-test capability inherent in the two units which comprise the identifier and tester assembly. The state of the power supply as well as the specific characteristics of the visual/audio response generator can be evaluated with ease by mating unit 9 with unit 14. The self-test response should be substantially identical to the response upon identifying the matching ends of a token ring cable.

Figure 4:
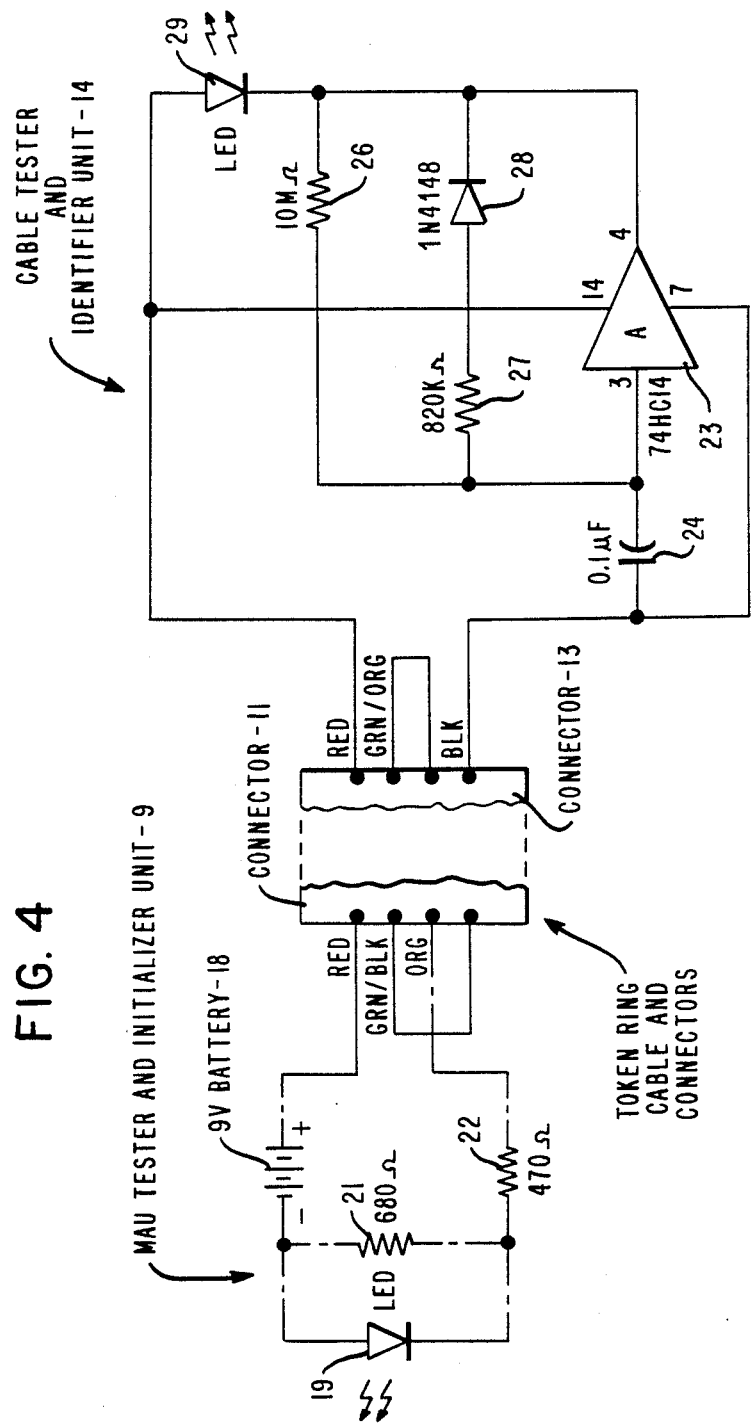
FIG. 4 is a schematic showing the electrical devices embodied in the two units of the portable identifier and tester assembly.

The electronic schematic for the preferred embodiment of the identifier and tester assembly is illustrated in FIG. 4. The MAU tester and initializer unit circuit preferably includes a nominal 9-volt battery 18, an LED 19, and a pair of resistors 21 and 22 to divide the voltage for LED 19 and to limit the battery current. The 9-volt battery is adequate to perform the MAU testing and initialization functions, yet is as noted earlier sufficiently greater than the nominal voltages generated by personal computer systems to be distinguishable.

The electrical circuitry within the cable tester and identifier unit 14 is shown at the right to include an astable multivibrator and an LED response signal generator. The multivibrator is configured from an operational amplifier 23, a 0.1 microfarad capacitor 24 connected to the inverting input, and a parallel arrangement of a 10M ohm resistor 26 with a 820 k ohm resistor 27 and diode 28. As configured, amplifier 23 pulses LED 29 at a nominal rate of one hertz when the cable is identified or the assembly units are mated for self-test. In contrast, the presence of a significantly lower voltage, for example six volts, between the red and the black lines of unit 14 inhibits all astable cycling and flashing of LED 29, while a materially greater voltage than nine volts between the rd and the black lines of unit 14 causes an abnormally greater oscillation frequency and flashing rate. The conditions are distinguishable by one of even moderate skill in the art of cable placement and identification.

As suggested by the block 17 in FIG. 3, the signal produced by unit 14 may be manifested by signals other than visual, for example audible responses.

Figure 5:
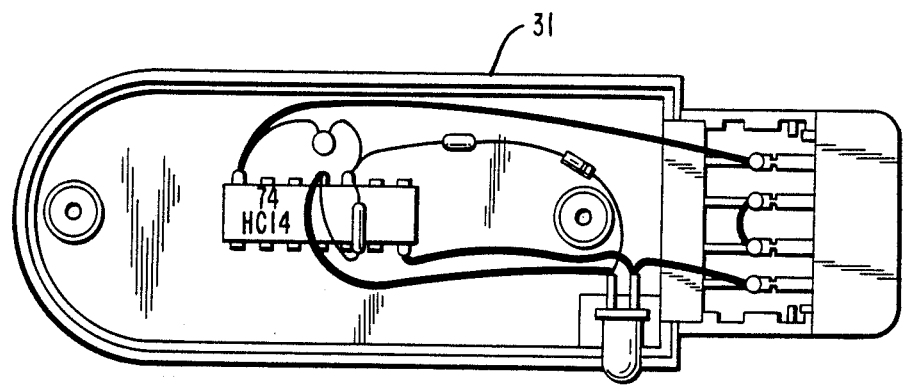
FIGS. 5 and 6 show the mechanical structures internal to one unit and the assembly of one unit, respectively.
Figure 6:
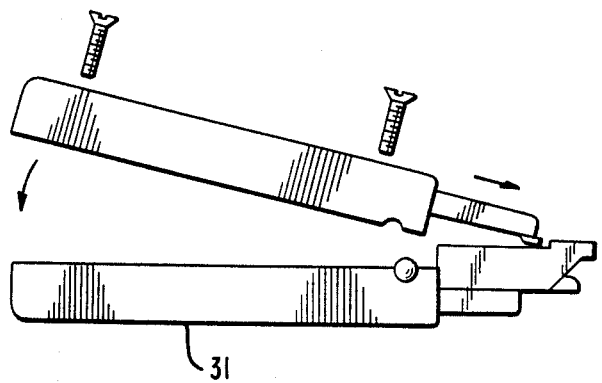

FIGS. 5 and 6 depict representative mechanical structures for the assembly units. FIG. 5 illustrates the circuit elements of the cable tester and identifier unit 14 within a housing 31, one end of which includes a token ring cable connector of the type commercially available as AMP P/N 554000-1 or T&B Ansley P/N 800-10DC. The connector and housing assemblies illustrated in FIGS. 5 and 6 are substantially identical to that used in the prior art for the basic MAU tester and initializer unit 9 previously depicted in FIGS. 3 and 4.

The identifier and tester assembly of the present invention thus provides a user of relatively nominal skill with a portable pair of instrumentation units which can be mated for self-test and then readily utilized to identify the matching ends of a four line token ring cable. The power supply end unit, known as the MAU tester and initializer, is connected to one end of the selected cable. Thereafter, at the distant location the second unit is sequentially with to cable connectors while observing the LED flash rate. The identifier and tester assembly requires no special switch settings, operates in the context of cables which have shorting bars, and responds at a prescribed and readily discernable LED flash rate. Inadvertently powered personal computer communication lines are ignored. Furthermore, the identifier simultaneously tests continuity through the four lines and connectors of the token ring cable being identified.

It will be understood by those skilled in the art that the embodiments as set forth here and before are merely exemplary of the various elements and procedures which are essential to the present invention, and as such may be replaced with equivalents without departing from the invention thereof, which now will be defined by appended claims.

What is claimed is:

1. A pair, first and second, of portable identifier and tester units for use with an electrical wiring cable composed of four or more lines having connectors at each end, comprising:
   a first portable identifier and tester, unit with a connector mateable to the connector at one end of the cable, and when mated providing a voltage between the first and the second lines of the cable and providing a direct, electrically common, connection between the third and the fourth lines of the cables; and
   a second, portable identifier and tester, unit with a connector mateable to the connector at the other end of the cable, and when mated providing a signal responsive to voltage from the first unit appearing between the first and the fourth lines of the cable and providing a direct, electrically common, connection between the second and the third lines of the cable.

2. The apparatus in claim 1, wherein the wiring cable connectors produce an electrical connection between the third and fourth lines and between the first and the second lines of the cable when the cable connectors are unmated.

3. The apparatus recited in claim 2, wherein the signal provided by the second unit varies relative to the voltage between the first and the fourth lines of the cable therein.

4. The apparatus recited in claim 3, wherein the signal is inhibited unless the voltage between the first and the fourth lines of the cable is greater than the nominal voltage generated by electronic equipment potentially connected to one end of the cable.

5. The apparatus recited in claim 4, wherein the first and second units are directly mateable to confirm operational integrity.

6. The apparatus recited in claim 3, wherein the signal is provided by an LED powered from a voltage responsive oscillator.

7. The apparatus recited in claim 6, wherein the first and second units are directly mateable to confirm operational integrity.

8. The apparatus recited in claim 7, wherein the voltage provided by the first unit is furnished by a battery, and the LED signal is generated by a free-running oscillator configured from an operational amplifier requiring a supply voltage greater than the nominal voltage generated by electronic equipment potentially connected to one end of the cable.

9. A pair, first and second, of portable identifier and tester units for use with four line token ring computer communication cables having substantially identical connectors at each end, comprising:
   a first, portable identifier and tester, unit with a connector mateable to the cable connector, and when mated providing a voltage materially greater than four volts between the first and second lines of the cable and providing an electrically shorting jumper between the third and the fourth lines of the cable; and
   a second, portable identifier and tester, unit with a connector mateable to the cable connector, and when mated providing a voltage responsive pulsating visual signal in response to the voltage from the first unit appearing between the first and the fourth lines of the cable and providing an electrically shorting jumper between the second and the third lines of the cable.

10. The apparatus recited in claim 9, wherein the voltage responsive pulsating visual signal is provided by an LED driven by a free-running oscillator configured from an operational amplifier requiring a supply voltage materially greater than four volts.

* * * * *